United States Patent
Butler et al.

(10) Patent No.: US 8,164,737 B2
(45) Date of Patent: Apr. 24, 2012

(54) LITHOGRAPHIC APPARATUS HAVING AN ACTIVE DAMPING SUBASSEMBLY

(75) Inventors: Hans Butler, Best (NL); Erik Roelof Loopstra, Eindhoven (NL); Marc Wilhelmus Maria Van Der Wijst, Veldhoven (NL); Joost De Pee, Veldhoven (NL); Cornelius Adrianus Lambertus De Hoon, Best (NL); Stijn Boschker, Pijnacker (NL)

(73) Assignee: ASML Netherlands B.V., Veldhoven (NL)

( * ) Notice: Subject to any disclaimer, the term of this patent is extended or adjusted under 35 U.S.C. 154(b) by 758 days.

(21) Appl. No.: 12/249,399

(22) Filed: Oct. 10, 2008

(65) Prior Publication Data

US 2009/0122284 A1    May 14, 2009

Related U.S. Application Data

(60) Provisional application No. 60/960,973, filed on Oct. 23, 2007.

(51) Int. Cl.
  *F16F 5/00* (2006.01)
  *F16F 7/10* (2006.01)
  *G03B 27/32* (2006.01)
  *G03B 27/42* (2006.01)

(52) U.S. Cl. ............ 355/53; 188/378; 267/140.11; 355/77

(58) Field of Classification Search ......... 188/266.7, 188/378–380; 248/550; 267/140.11–140.15; 318/611, 623, 649; 355/53, 67, 72, 75, 77
See application file for complete search history.

(56) References Cited

U.S. PATENT DOCUMENTS

| | | | |
|---|---|---|---|
| 6,472,840 B1 | 10/2002 | Takahashi | |
| 2002/0102481 A1* | 8/2002 | Lee et al. | 430/9 |
| 2006/0272910 A1 | 12/2006 | Kraner | |
| 2007/0097340 A1 | 5/2007 | Yuan | |

FOREIGN PATENT DOCUMENTS

| | | |
|---|---|---|
| EP | 1225482 A1 | 7/2002 |
| JP | 2005311165 A | 11/2005 |
| JP | 2006250291 A | 9/2006 |
| WO | 2005/073592 A1 | 8/2005 |

OTHER PUBLICATIONS

Search report and written opinion in related European application No. 200807848-7 mailed Jan. 5, 2010.

* cited by examiner

*Primary Examiner* — Hung Henry Nguyen
*Assistant Examiner* — Colin Kreutzer
(74) *Attorney, Agent, or Firm* — Pillsbury Winthrop Shaw Pittman LLP

(57) ABSTRACT

A lithographic apparatus includes a projection system to project a patterned radiation beam onto a substrate, and a damping system to dampen a vibration of at least part of the projection system, the damping system including an interface damping mass and an active damping subsystem to dampen a vibration of at least part of the interface damping mass, the interface damping mass connected to the projection system, and the active damping subsystem connected to the interface damping mass, the active damping subsystem including a sensor to measure a position quantity of the interface damping mass and an actuator to exert a force on the interface damping mass based on a signal provided by the sensor. The damping system further includes an interface damping device connected to the interface damping mass and configured to damp a movement of the interface damping mass at an eigenfrequency of the interface damping mass.

17 Claims, 3 Drawing Sheets

LITHOGRAPHIC APPARATUS HAVING AN ACTIVE DAMPING SUBASSEMBLY

CROSS REFERENCE TO RELATED APPLICATIONS

The present patent application claims priority under 35 U.S.C. §119(e) to U.S. Provisional Application Ser. No. 60/960,973, filed on Oct. 23, 2007, titled "Lithographic Apparatus Having an Active Damping Subassembly", the content of which is incorporated herein in its entirety by reference.

FIELD

The present invention relates to a lithographic apparatus and to a projection assembly having an improved active damping.

BACKGROUND

A lithographic apparatus is a machine that applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

The high accuracy and high resolution currently aimed at in lithography may require an accurate positioning of parts of the lithographic apparatus such as the reticle stage to hold the patterning device (e.g. mask), the projection system and the substrate table to hold the substrate, with respect to each other. Apart from the positioning of e.g. the reticle stage and the substrate table, this also poses requirements on the projection system. The projection system in current implementations may consist of a carrying structure, such as a lens mount (in case of transmissive optics) or a mirror frame (in case of reflective optics) and a plurality of optical elements such as lens elements, mirrors, etc. In operation, the projection system may be subject to vibrations due to a plurality of causes. As an example, movements of parts in the lithographic apparatus may result in vibrations of a frame to which the projection system is attached, a movement of a stage such as the substrate stage or the reticle stage, or accelerations/decelerations thereof, which may result in a gas stream and/or turbulence and/or acoustic waves affecting the projection system. Such disturbances may result in vibrations of the projection system as a whole or of parts thereof. By such vibrations, displacements of lens elements or mirrors may be caused, which may in turn result in an imaging error, i.e. an error in the projection of the pattern on the substrate.

Commonly, a damping system is provided to dampen vibrations of the projection system or parts thereof. Thereto, a damping system may be provided as known in many forms. In a configuration, the damping system may include an interface damping mass to absorb vibrations of at least part of the projection system, as well as an active damping subsystem to dampen a vibration of at least part of the interface damping mass. With this, the interface damping mass is connected to the projection system, and the active damping subsystem is connected to the interface damping mass. In this document, the term active damping system is to be understood as a damping system which includes a sensor to detect an effect of a vibration (e.g. a position sensor, velocity sensor, acceleration sensor, etc) and an actuator to act on the structure to be damped or a part thereof, the actuator being driven by e.g. a controller in dependency of a signal provided by the sensor. By driving the actuator in dependency of the signal provided by the sensor, an effect of vibrations on the projection system and/or the interface damping mass connected therewith, may be reduced or cancelled to a certain extent. An example of such an active damping system may be provided by a feedback loop: the sensor to provide a position quantity, such as a position, speed, acceleration, jerk, etc of the interface damping mass or a part thereof, the controller being provided with the position quantity and generating a controller output signal to drive the actuator, the actuator in turn acting on the interface damping mass or the part thereof so that a feedback loop is provided. The controller may be formed by any type of controller and may be implemented in the software to be executed by a microprocessor, microcontroller, or any other programmable device, or may be implemented by dedicated hardware.

It is desirable to stabilize the feedback loop, i.e. to achieve a frequency behavior of the feedback loop wherein internal resonances are prevented. At the same time, a high bandwidth of the active damping system is desired, as a high bandwidth of the active damping system will allow to suppress vibrations within such high bandwidth. Due to the ever increasing demands on speed of the lithographic apparatus, movements in the lithographic apparatus tend to take place at a higher speed and consequently involving faster transients, which may result in a generation of vibrations at increasingly higher frequencies. Therefore, a demand comes forward towards a higher bandwidth of the active damping system. For the damping system to work properly, the interface damping mass needs to behave like a rigid body over a very large frequency range. However, the interface damping mass, for example a solid block of steel or other material, already has internal dynamic behavior. If for example the interface damping mass weighs 10 kg, then a minimum internal resonance frequency of the interface damping mass may lie around 15 kHz. This resonance frequency is visible in the transfer functions of the entire damping system, and limits the achievable performance.

The projection system housing may due to external forces, such as forces caused by mechanical vibrations, acoustics, air flows, be excited at the eigenfrequencies of one or more lens elements arranged in the projection system housing. The resulting movements of the projection system housing will be taken into account in the servo control loop of the substrate and/or patterning device support, which attempts to position the support with respect to the projection system housing. However, the frequency with which the projection system housing vibrates may be too high for the support to follow, hence inducing imaging errors because the relative position of the support and the projection system housing is not according to the desired position. Alternatively, an increased settling time of the servo systems could be used to wait until the projection system housing stops vibrating, which settling time would have to be large since these lens elements are mounted in the projection system housing with a mounting having a low damping. As a result the overall throughput of the lithographic apparatus is negatively influenced.

SUMMARY

It is desirable to provide a lithographic apparatus in which the imaging accuracy and/or the throughput is improved.

According to an embodiment of the invention, there is provided a lithographic apparatus including an illumination system configured to condition a radiation beam; a support constructed to support a patterning device, the patterning device being capable of imparting the radiation beam with a pattern in its cross-section to form a patterned radiation beam; a substrate table constructed to hold a substrate; a projection system configured to project the patterned radiation beam onto a target portion of the substrate; and a damping system to dampen a vibration of at least part of the projection system, the damping system including an interface damping mass and an active damping subsystem to dampen a vibration of at least part of the interface damping mass, the interface damping mass being connected to the projection system, and the active damping subsystem being connected to the interface damping mass, the active damping subsystem including a combination of a sensor to measure a position quantity of the interface damping mass and an actuator to exert forces on the interface damping mass in dependency of signals provided by the sensor, wherein the damping system further includes an interface damping device which is connected to the interface damping mass and which is configured to damp movements of the interface damping mass at an eigenfrequency of the interface damping mass.

In another embodiment of the invention, there is provided a lithographic apparatus including an illumination system configured to condition a radiation beam; a support constructed to support a patterning device, the patterning device being capable of imparting the radiation beam with a pattern in its cross-section to form a patterned radiation beam; a substrate table constructed to hold a substrate; a projection system configured to project the patterned radiation beam onto a target portion of the substrate; and a damping system to dampen a vibration of at least part of the projection system, the damping system including an interface damping mass and an active damping subsystem to dampen a vibration of at least part of the interface damping mass, the interface damping mass being connected to the projection system, and the active damping subsystem being connected to the interface damping mass, the active damping subsystem including a combination of a sensor to measure a position quantity of the interface damping mass and an actuator to exert forces on the interface damping mass in dependency of signals provided by the sensor, the active damping subsystem including a reaction mass for the actuator to exert a counterforce upon in dependency of signals provided by the sensor, wherein the reaction mass is guided with a substantially friction free bearing in a translational direction with respect to the interface damping mass.

According to a further embodiment of the invention, there is provided a projection system including a damping system to dampen a vibration of at least part of the projection system, the damping system including an interface damping mass and an active damping subsystem to dampen a vibration of at least part of the interface damping mass, the interface damping mass being connected to the projection system, and the active damping subsystem being connected to the interface damping mass, the active damping subsystem including a combination of a sensor to measure a position quantity of the interface damping mass and an actuator to exert forces on the interface damping mass in dependency of signals provided by the sensor, wherein the damping system further includes an interface damping device which is connected to the interface damping mass and which is configured to damp movements of the interface damping mass at an eigenfrequency of the interface damping mass.

According to a still further embodiment of the invention, there is provided a projection system including a damping system to dampen a vibration of at least part of the projection system, the damping system including an interface damping mass and an active damping subsystem to dampen a vibration of at least part of the interface damping mass, the interface damping mass being connected to the projection system, and the active damping subsystem being connected to the interface damping mass, the active damping subsystem including a combination of a sensor to measure a position quantity of the interface damping mass and an actuator to exert forces on the interface damping mass in dependency of signals provided by the sensor, the active damping subsystem including a reaction mass for the actuator to exert a counterforce upon in dependency of signals provided by the sensor, wherein the reaction mass is guided with a substantially friction free bearing in a translational direction with respect to the interface damping mass.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
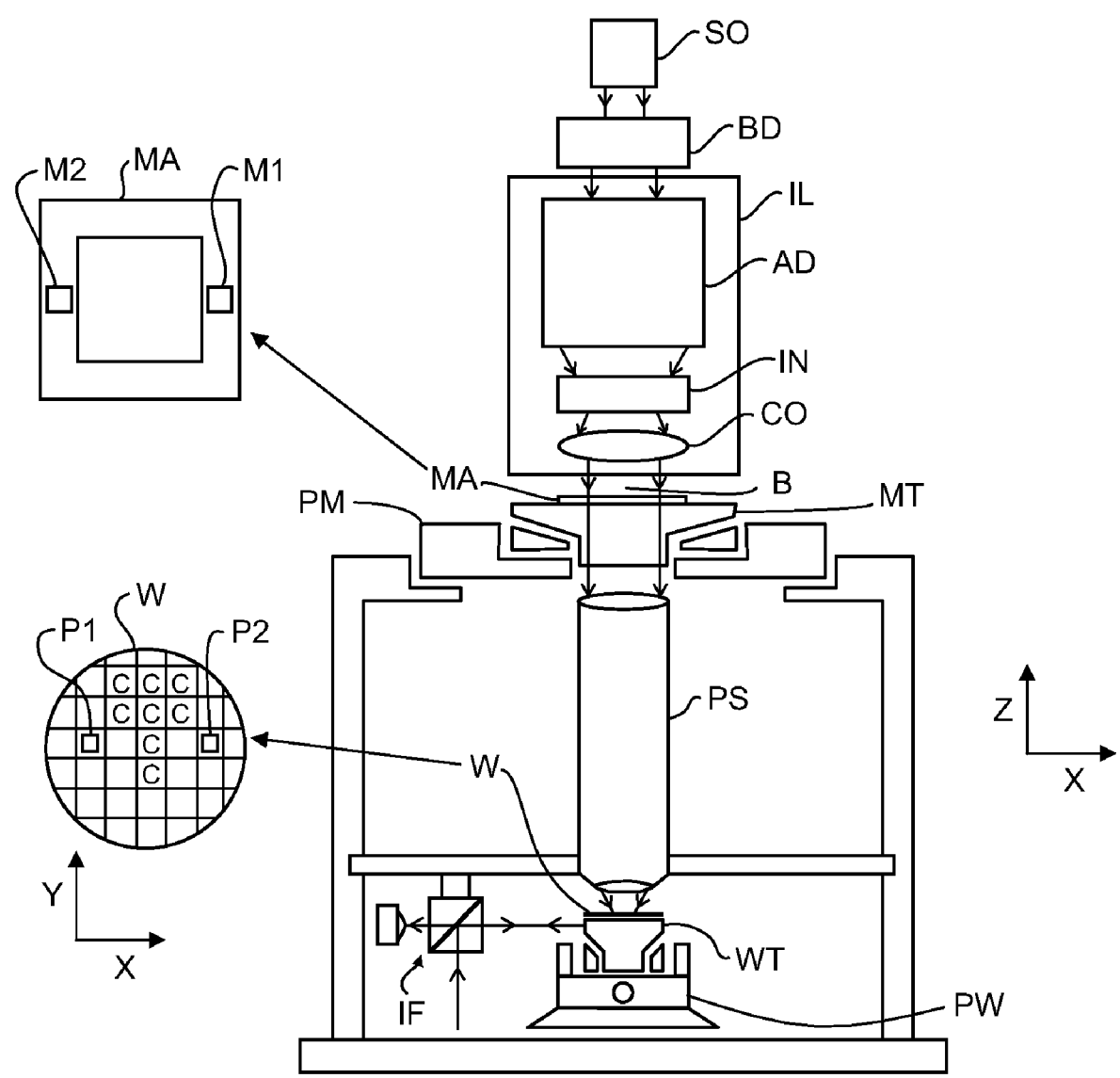
FIG. 1 depicts a lithographic apparatus according to an embodiment of the invention.

FIG. 1 schematically depicts a lithographic apparatus according to one embodiment of the invention. The apparatus includes an illumination system (illuminator) IL configured to condition a radiation beam B (e.g. UV radiation or any other suitable radiation), a support structure or pattern support or support (e.g. a mask table) MT constructed to support a patterning device (e.g. a mask) MA and connected to a first positioning device PM configured to accurately position the patterning device in accordance with certain parameters. The apparatus also includes a substrate table (e.g. a wafer table) WT or "substrate support" constructed to hold a substrate (e.g. a resist-coated wafer) W and connected to a second positioning device PW configured to accurately position the substrate in accordance with certain parameters. The apparatus further includes a projection system (e.g. a refractive projection lens system) PS configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that may be used to impart a radiation beam with a pattern in its cross-section so as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables or "substrate supports" (and/or two or more mask tables or "mask supports"). In such "multiple stage" machines the additional tables or supports may be used in parallel, or preparatory steps may be carried out on one or more tables or supports while one or more other tables or supports are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the patterning device (e.g. mask) and the projection system. Immersion techniques can be used to increase the numerical aperture of projection systems. The term "immersion" as used herein does not mean that a structure, such as a substrate, must be submerged in liquid, but rather only means that a liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. Having traversed the patterning device (e.g. mask) MA, the radiation beam B passes through the projection system PS, which focuses the beam onto a target portion C of the substrate W. With the aid of the second positioning device PW and position sensor IF (e.g. an interferometric device, linear encoder or capacitive sensor), the substrate table WT can be moved accurately, e.g. so as to position different target portions C in the path of the radiation beam B. Similarly, the first positioning device PM and another position sensor (which is not explicitly depicted in FIG. 1) can be used to accurately position the patterning device (e.g. mask) MA with respect to the path of the radiation beam B, e.g. after mechanical retrieval from a mask library, or during a scan. In general, movement of the support structure (e.g. mask table) MT may be realized with the aid of a long-stroke module (coarse positioning) and a short-stroke module (fine positioning), which form part of the first positioning device PM. Similarly, movement of the substrate table WT or "substrate support" may be realized using a long-stroke module and a short-stroke module, which form part of the second positioner PW. In the case of a stepper (as opposed to a scanner) the support structure (e.g. mask table) MT may be connected to a short-stroke actuator only, or may be fixed. Patterning device (e.g. mask) MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device (e.g. mask) MA, the mask alignment marks may be located between the dies.

The depicted apparatus could be used in at least one of the following modes:

1. In step mode, the support structure (e.g. mask table) MT or "mask support" and the substrate table WT or "substrate support" are kept essentially stationary, while an entire pattern imparted to the radiation beam is projected onto a target portion C at one time (i.e. a single static exposure). The substrate table WT or "substrate support" is then shifted in the X and/or Y direction so that a different target portion C can be exposed. In step mode, the maximum size of the exposure field limits the size of the target portion C imaged in a single static exposure.
2. In scan mode, the support structure (e.g. mask table) MT or "mask support" and the substrate table WT or "substrate support" are scanned synchronously while a pattern imparted to the radiation beam is projected onto a target portion C (i.e. a single dynamic exposure). The velocity and direction of the substrate table WT or "substrate support" relative to the mask table MT or "mask support" may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.
3. In another mode, the support structure (e.g. mask table) MT or "mask support" is kept essentially stationary holding a programmable patterning device, and the substrate table WT or "substrate support" is moved or scanned while a pattern imparted to the radiation beam is projected onto a target portion C. In this mode, generally a pulsed radiation source is employed and the programmable patterning device is updated as required after each movement of the substrate table WT or "substrate support" or in between successive radiation pulses during a scan. This mode of operation may be readily applied to maskless lithography that utilizes programmable patterning device, such as a programmable mirror array of a type as referred to above.

Combinations and/or variations on the above described modes of use or entirely different modes of use may also be employed.

Figure 2:
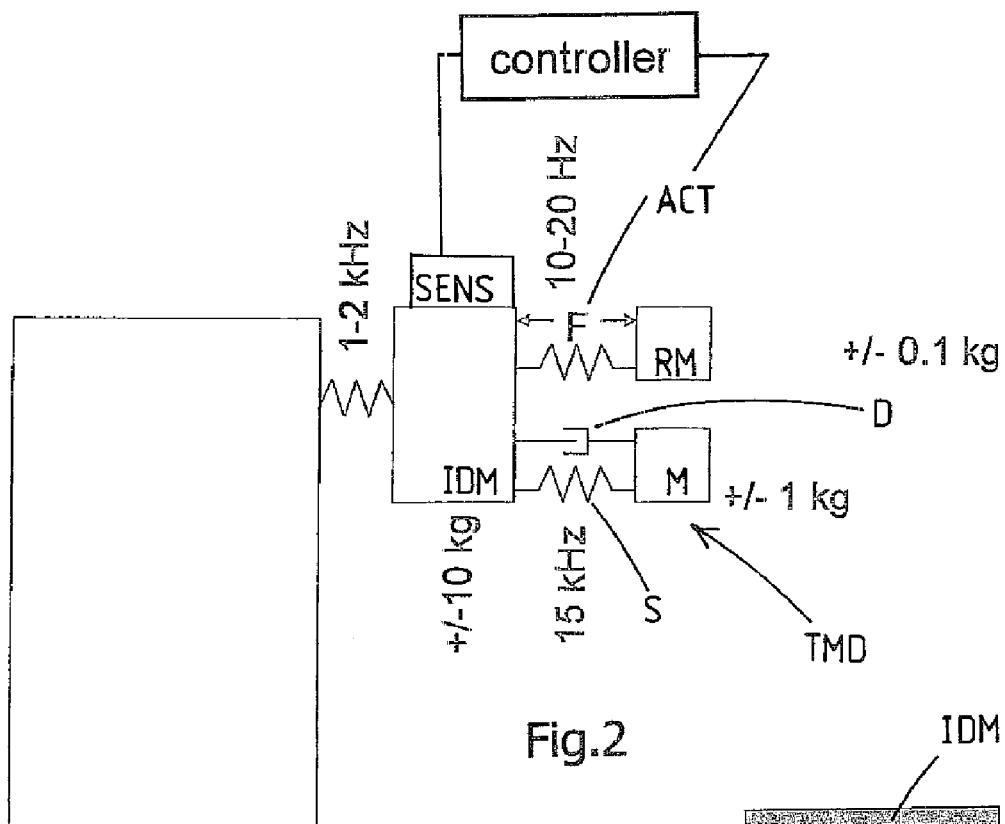
FIG. 2 shows a schematic view of a damping system with a tuned mass damper connected thereto according to an embodiment of the invention.

FIG. 2 depicts a highly schematic view of a projection system PS in accordance with an embodiment of the invention. The projection system PS may be held in a metrology frame by any suitable devices, e.g. including a rigid mounting, a resilient mounting, etc. An interface damping mass IDM which may include any object, preferably a rigid mass, is connected to the projecting system PS. A vibration of the projection system PS results in a vibration of the interface damping mass IDM. Such vibration of the interface damping mass IDM is sensed by a sensor SENS of an active damping subsystem, which may include any type of vibration sensor, such as a position measurement sensor, a velocity measurement sensor, an acceleration measurement sensor, etc. An actuator ACT of the active damping subsystem is provided which acts on the interface damping mass IDM. In this embodiment, the actuator is connected between a reaction mass RM of the active damping subsystem and the interface damping mass IDM. It is noted that any other reaction body such as, for example, a base frame of the lithographic apparatus or other reference may also be used for the actuator ACT to exert its counterforces upon. The actuator ACT may include any suitable type of actuator, such as a piezo electric actuator, a motor, etc. In a preferred embodiment, use is made of a Lorentz actuator, as thereby a contactless actuator may be provided which does not provide for a mechanical contact between the reaction mass RM and the interface damping mass IDM, as the Lorentz actuator may provide for a contactless exertion with respective parts connected to the reaction mass RM and the interface damping mass IDM respectively.

The actuator is to be driven (e.g. using a suitable controller) in dependency of, i.e. based on, a signal provided by the sensor SENS, the output signal of the sensor SENS thereby providing an input signal to the controller (not shown in FIG. 2).

The frequency behavior, as observed from the actuator ACT to the sensor SENS, is dominated by the interface damping mass IDM. It is desirable that the interface damping mass IDM forms a rigid body mass, at least in a frequency band of the active damping system, which will result in the sensor SENS and actuator ACT to observe a transfer function substantially corresponding to a rigid body mass. Effectively, as seen from the sensor SENS and actuator ACT, the resonant behavior of the projection system PS is masked by the presence of the interface damping mass IDM which is effectively interposed between the sensor SENS and actuator ACT on the one hand and the projection system PS on the other hand. As a consequence, a phase of the transfer function as of the frequency will show a more constant behavior, thereby possibly favoring a stable behavior of the active damping system including the sensor SENS and the actuator ACT.

The interface damping mass IDM may be connected to the projection system PS via a resilient connection, including e.g. a spring, such as a damped spring. Preferably the interface damping mass IDM is coupled with approximately 1-2 kHz to the projection system PS. Thereby, an effective decoupling of the vibrations and resonances of parts of the projection system PS may be provided.

The interface damping mass IDM may be connected to any relevant part of the projection system PS, in a practical implementation of a transmissive projection system, the damping mass may be connected to a lens mount (i.e. a mount for a plurality of lens elements thereof). In the case of a reflective projection system, the interface damping mass IDM may be connected e.g. to a frame holding one or more of the mirrors. Thereby, the projection system PS and its constituting parts may be effectively damped, as connecting the interface damping mass (and therefore connecting the active damping system) to the lens mount or frame may have effect on a plurality of constituting parts of the projection system, e.g. lens elements, mirrors, etc, as these constituting elements are all in turn connected to the lens mount or reference frame.

A mass of the interface damping mass IDM preferably is selected between about 0.001 and 0.1 times a mass of the projection system PS, more preferably between about 0.001 and 0.01 times the mass of the projection system PS, as thereby the frequency of the interface damping mass IDM may be provided in a frequency range being within a desired bandwidth of the active damping system, thereby favoring a stable closed loop operation of the active damping system.

The reaction mass RM may be connected to the interface damping mass IDM via a damped spring. Above a resonance frequency of the spring, the reaction mass RM will substantially be stationary when actuating the actuator ACT, and hence allows exerting a force on the projection system PS. The reaction mass RM preferably is coupled with zero stiffness (0 Hz) to the interface damping mass IDM, but in practice a frequency range of about 10-20 Hz is acceptable.

According to an embodiment of the invention, some particular resonances in the interface damping mass IDM, that is to say eigenfrequencies of the interface damping mass IDM, are dampened by connecting a passive interface damping device to the interface damping mass IDM. In the embodiment shown in FIG. 2, this passive interface damping device is formed by a tuned mass damper TMD. The tuned mass damper TMD is arranged externally of the interface damping mass IDM, and includes a mass M which is connected via a spring S and a damper D to the interface damping mass IDM. The mass M, the spring S and the damper D are chosen such that movement of the interface damping mass IDM at the selected eigenfrequency is substantially damped. As a result, the frequency transfer functions from actuator ACT to sensor SENS is no longer disturbed by the internal resonance frequency of the IDM. This allows the controller that calculates a force F of actuator ACT based on a measurement value from sensor SENS to have a higher gain and hence improves the damping performance of the device. Hence, the position of the interface damping mass IDM and thus also of the projection system PS is more stable and the servo system of the substrate support and/or patterning device may more easily follow the position of the projection system PS, therewith making smaller imaging errors and a higher throughput in the lithographic apparatus possible. Also, vibrations of internal elements in the projection system PS are reduced, and hence the imaging performance of the projection system PS is further improved.

The tuned mass damper shown in FIG. 2 is tuned at the internal eigenfrequency of the interface damping mass IDM. The minimum eigenfrequency of the interface damping mass IDM lies typically in the range of about 10-20 kHz, in particular around 15 kHz, depending on the mass of the IDM and the used material, which influences the internal stiffness of the IDM.

In view of the relative large mass of the projection system PS, the mass used for the tuned mass damper is relatively small due to the provision of the interface damping mass IDM. Any mass suitable to serve as a tuned mass damper according to an embodiment of the invention may be applied. The "tuned mass" preferably weighs between about 5-15%, more in particular approximately about 10%, of the interface damping mass IDM. If, for example, the interface damping mass IDM is approximately 10 kg, then the tuned mass damper TMD preferably weighs approximately 1 kg. Hence the tuned mass damper may have a much higher internal eigenfrequency. Thus, the internal resonances of the interface damping mass IDM are efficiently damped, allowing higher controller bandwidth and hence a higher damping performance of the damping system for the projection system PS.

Figure 3:
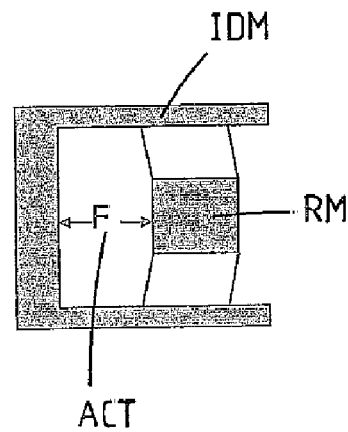
FIG. 3 shows a schematic view of a guiding structure for the reaction mass of FIG. 2 with respect to the interface damping mass according to an embodiment of the invention.
Figure 4:
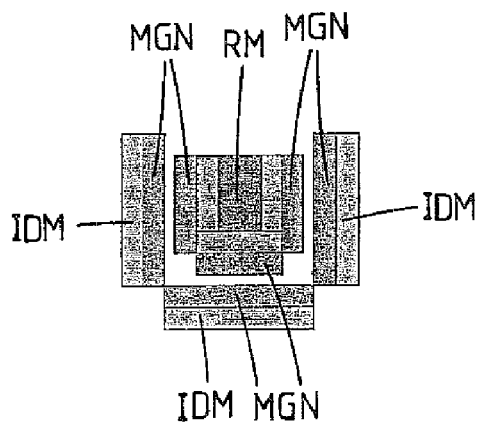
FIG. 4 shows a schematic view of a guiding structure for the reaction mass of FIG. 2 with respect to the interface damping mass according to an embodiment of the invention.

The reaction mass RM may be coupled to the interface damping mass IDM with, for example, leaf springs (see FIG. 3). However, such a spring construction has an eigenfrequency of approximately 15 Hz, and, therefore, it may not be possible to use the damping system for low frequencies. Lowering the stiffness of the leaf springs would lower this frequency, but would also decrease parasitic resonance frequencies (tilt modes) of the reaction mass RM. These modes are currently around 15 kHz, and lowering this frequency would severely decrease the controllability of the damping system. To overcome this, according to another embodiment of the invention, the reaction mass RM may be guided with a substantially friction free contactless bearing in a translational direction with respect to the interface damping mass. FIG. 4 shows an embodiment wherein a passive magnetic bearing is used to guide the reaction mass RM with respect to the interface damping mass IDM. With this, both the reaction mass RM and the interface damping mass IDM are provided with oppositely directed magnets MGN. The magnets MGN may include permanent magnets and/or electromagnets. The interface damping mass IDM preferably includes a funnel shaped guiding structure delimiting the reaction mass RM both downwards and sideways of the horizontal translational direction for the reaction mass RM. Between the bottom and side walls of this guiding structure and reaction mass the respective magnets MGN are provided.

The mass of the reaction mass RM may act as a vertical pretension, and is sufficient to keep the mover inside the guiding structure of the interface damping mass IDM. Alternatively, other forms of contactless bearings could be used, for example, using a hydrostatic bearing or air bearing. The contactless bearing reduces the lowest eigenfrequencies to almost zero, making it possible for the damping system to perform at even lower frequencies. It is noted that this aspect of the substantially friction free bearing for the reaction mass is beneficial for all kinds of uses of such an active damping subsystem for an interface damping mass, and may both be used in a damping system with or without an interface damping device, which is connected to the interface damping mass and which is configured to damp movements of the interface damping mass at an eigenfrequency of the interface damping mass.

Besides the embodiments shown numerous variants are possible. For example the interface damping mass may also include a damping material added to the interface damping mass, in particular between different parts thereof, the damping material being configured to damp movements of the interface damping mass at eigenfrequencies thereof.

Figure 5:
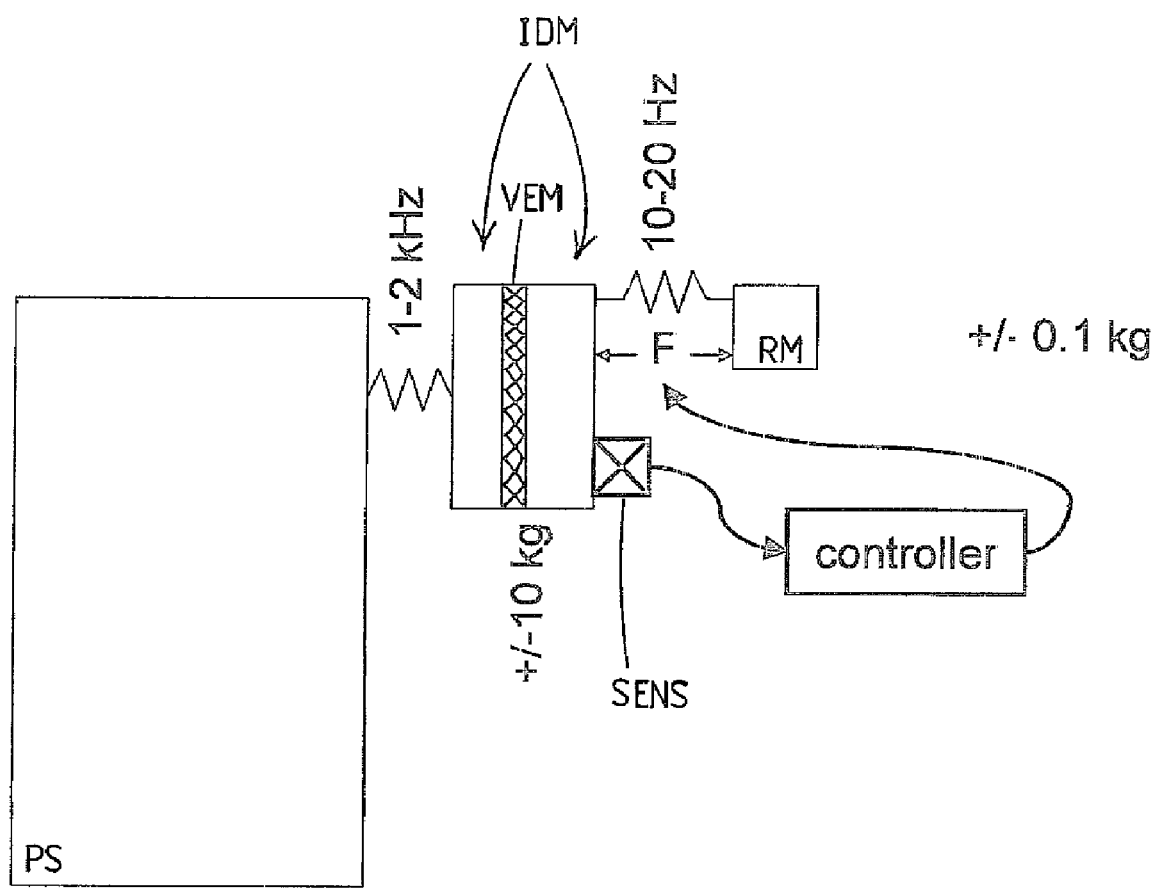
FIG. 5 shows a schematic view of a damping system with a tuned mass damper connected thereto according to an embodiment of the invention.

As shown in FIG. 5, the damping material may for example be a visco-elastic material VEM, provided between two parts of the interface damping mass IDM, and configured to damp movements of the two-part interface damping mass IDM at the eigenfrequency thereof.

Instead of using a spring and damper, the tuned mass damper may also be connected to the interface damping mass using any other defined resilient connection and damping construction. For example, the resilient connection may be a connection with a certain defined stiffness, and the damping construction might be a visco-elastic material providing a damping of a few percent. Furthermore, the effect of the tuned mass damper has been explained with reference to one degree of freedom. The same effect may be obtained for other degrees of freedom by providing a damping device being capable of damping movement in more than one degree of freedom and/or by providing different damping devices for different degrees of freedom.

Although in the above, embodiments of the invention have been described with reference to a projection system of a lithographic apparatus, some embodiments of the invention may be applied to any projection system, or even more generally to any structure which is to be mechanically damped by an active damping system. Thus, embodiments of the invention described in this document may be provided as lithographic apparatus including a projection system and an active damping system, as a projection assembly including a projection system and an active system, and as a combination of a structure and an active damping system to dampen the structure.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that embodiments of the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A lithographic apparatus comprising:
   an illumination system configured to condition a radiation beam;
   a support configured to support a patterning device, the patterning device being capable of imparting the radiation beam with a pattern in its cross-section to form a patterned radiation beam;
   a substrate table configured to hold a substrate;
   a projection system configured to project the patterned radiation beam onto a target portion of the substrate; and
   a damping system configured to dampen a vibration of at least part of the projection system, the damping system comprising
      an interface damping mass connected to the projection system;
      an active damping subsystem configured to dampen a vibration of at least part of the interface damping mass, the active damping subsystem connected to the interface damping mass, the active damping subsystem comprising
         a sensor configured to measure a position quantity of the interface damping mass; and
         an actuator configured to exert a force on the interface damping mass based on a signal provided by the sensor; and
      an interface damping device connected to the interface damping mass and configured to damp a movement of the interface damping mass at an eigenfrequency of the interface damping mass.

2. The lithographic apparatus according to claim 1, wherein the interface damping device is a tuned mass damper, tuned on the eigenfrequency of the interface damping mass.

3. The lithographic apparatus according to claim 2, wherein a mass of the tuned mass damper is between 0.05 and 0.15 times the interface damping mass.

4. The lithographic apparatus according to claim 2, wherein the tuned mass damper is coupled to the interface damping mass via a resilient connection and a damping connection.

5. The lithographic apparatus according to claim 2, wherein the tuned mass damper is coupled to the interface damping mass in a frequency range of about 10-20 kHz.

6. The lithographic apparatus according to claim 1, wherein the interface damping mass is coupled to the projection system in a frequency range of about 1-2 kHz.

7. The lithographic apparatus according to claim 1, wherein the interface damping mass is coupled to the projection system via a resilient connection.

8. The lithographic apparatus according to claim 1, wherein the active damping subsystem comprises a reaction mass for the actuator to exert counterforces upon based on signals provided by the sensor, which reaction mass is coupled to the interface damping mass in a frequency range of about 10-20 Hz.

9. A lithographic apparatus comprising:
   an illumination system configured to condition a radiation beam;
   a support configured to support a patterning device, the patterning device being capable of imparting the radiation beam with a pattern in its cross-section to form a patterned radiation beam;
   a substrate table configured to hold a substrate;
   a projection system configured to project the patterned radiation beam onto a target portion of the substrate; and
   damping system configured to dampen a vibration of at least part of the projection system, the damping system comprising
      an interface damping mass connected to the projection system; and
      an active damping subsystem to dampen a vibration of at least part of the interface damping mass, the active damping subsystem being connected to the interface damping mass, the active damping subsystem comprising
         a sensor configured to measure a position quantity of the interface damping mass;
         an actuator configured to exert a force on the interface damping mass based on a signal provided by the sensor; and
         a reaction mass for the actuator to exert a counterforce upon based on a signal provided by the sensor,
      wherein the reaction mass is guided with a substantially frictionless bearing in a translational direction with respect to the interface damping mass.

10. The lithographic apparatus according to claim 9, wherein the substantially frictionless bearing is a magnetic bearing.

11. The lithographic apparatus according to claim 9, wherein the substantially frictionless bearing is a hydrostatic bearing.

12. The lithographic apparatus according to claim 9, wherein the interface damping mass comprises a guiding structure delimiting the reaction mass downwards and sideways of the translational direction, between which guiding structure and reaction mass the substantially friction free bearing is provided.

13. The lithographic apparatus according to claim 9, wherein the damping system further comprises an interface damping device connected to the interface damping mass and configured to damp movements of the interface damping mass at an eigenfrequency of the interface damping mass, the interface damping device being a tuned mass damper, tuned on an eigenfrequency of the interface damping mass.

14. A projection system comprising:
a damping system configured to dampen a vibration of at least part of the projection system, the damping system comprising
an interface damping mass connected to the projection system; and
an active damping subsystem to dampen a vibration of at least part of the interface damping mass, the active damping subsystem connected to the interface damping mass, the active damping subsystem comprising
a sensor configured to measure a position quantity of the interface damping mass; and
an actuator configured to exert a force on the interface damping mass based on a signal provided by the sensor, and
an interface damping device connected to the interface damping mass and configured to damp movements of the interface damping mass at an eigenfrequency of the interface damping mass.

15. The projection system of claim 14, wherein the interface damping device is a tuned mass damper, tuned on the eigenfrequency of the interface damping mass.

16. A projection system comprising:
a damping system configured to dampen a vibration of at least part of the projection system, the damping system comprising
an interface damping mass connected to the projection system; and
an active damping subsystem configured to dampen a vibration of at least part of the interface damping mass, the active damping subsystem connected to the interface damping mass, the active damping subsystem comprising
a sensor configured to measure a position quantity of the interface damping mass;
an actuator configured to exert a force on the interface damping mass based on a signal provided by the sensor; and
a reaction mass for the actuator to exert a counterforce upon based on a signal provided by the sensor,
wherein the reaction mass is guided with a substantially friction less bearing in a translational direction with respect to the interface damping mass.

17. The projection system of claim 16, wherein the damping system further comprises an interface damping device connected to the interface damping mass and configured to damp movements of the interface damping mass at an eigenfrequency of the interface damping mass, the interface damping device being a tuned mass damper, tuned on an eigenfrequency of the interface damping mass.

* * * * *